United States Patent
Dunklee et al.

(10) Patent No.: US 7,250,779 B2
(45) Date of Patent: Jul. 31, 2007

(54) PROBE STATION WITH LOW INDUCTANCE PATH

(75) Inventors: John Dunklee, Tigard, OR (US); Clarence E. Cowan, Newberg, OR (US)

(73) Assignee: Cascade Microtech, Inc., Beaverton, OR (US)

(*) Notice: Subject to any disclaimer, the term of this patent is extended or adjusted under 35 U.S.C. 154(b) by 0 days.

(21) Appl. No.: 10/672,655

(22) Filed: Sep. 25, 2003

(65) Prior Publication Data

US 2005/0099192 A1    May 12, 2005

Related U.S. Application Data

(60) Provisional application No. 60/429,082, filed on Nov. 25, 2002.

(51) Int. Cl.
*G01R 31/02* (2006.01)
*G01R 31/28* (2006.01)

(52) U.S. Cl. .................... 324/754; 324/765; 324/158.1

(58) Field of Classification Search ........ 324/750–765, 324/158.1
See application file for complete search history.

(56) References Cited

U.S. PATENT DOCUMENTS

| | | |
|---|---|---|
| 1,337,866 A | 4/1920 | Whitaker |
| 2,142,625 A | 1/1939 | Zoethout |
| 2,197,081 A | 4/1940 | Piron |
| 2,376,101 A | 5/1945 | Tyzzer |
| 2,389,668 A | 11/1945 | Johnson |
| 2,471,697 A | 5/1949 | Rappl |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziejowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |

(Continued)

FOREIGN PATENT DOCUMENTS

DE    29 12 826    10/1980

(Continued)

OTHER PUBLICATIONS

Knauer, William, "Fixturing for Low Current/Low-Voltage Parametric Testing," *Evaluation Engineering*, pp. 150-153, Nov. 1990.

(Continued)

*Primary Examiner*—Ha Tran Nguyen
*Assistant Examiner*—Emily Y Chan
(74) *Attorney, Agent, or Firm*—Chernoff, Vilhauer, McClung & Stenzel

(57) ABSTRACT

A probe assembly suitable for making test measurements using test signals having high currents. The disclosed probe assembly provides for a test signal exhibiting relatively low inductance when compared to existing probe assemblies by preferably reducing the electrical path distance between the test instrumentation and the electrical device being tested.

9 Claims, 6 Drawing Sheets

U.S. PATENT DOCUMENTS

| | | |
|---|---|---|
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,648,169 A | 3/1972 | Wiesler |
| 3,654,573 A | 4/1972 | Graham |
| 3,662,318 A | 5/1972 | Decuyper |
| 3,710,251 A | 1/1973 | Hagge et al. |
| 3,714,572 A | 1/1973 | Ham et al. |
| 3,775,644 A | 11/1973 | Cotner et al. |
| 3,777,260 A | 12/1973 | Davies et al. |
| 3,810,017 A | 5/1974 | Wiesler et al. |
| 3,814,888 A | 6/1974 | Bowers et al. |
| 3,829,076 A | 8/1974 | Sofy |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,970,934 A | 7/1976 | Aksu |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,528,504 A | 7/1985 | Thornton, Jr. et al. |
| 4,531,474 A | 7/1985 | Inuta |
| 4,532,423 A | 7/1985 | Tojo et al. |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,970 A | 5/1986 | Donecker et al. |
| 4,621,169 A | 11/1986 | Petinelli et al. |
| 4,626,618 A | 12/1986 | Takaoka et al. |
| 4,642,417 A | 2/1987 | Ruthrof et al. |
| 4,646,005 A | 2/1987 | Ryan |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,711,563 A | 12/1987 | Lass |
| 4,712,370 A | 12/1987 | MacGee |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,744,041 A | 5/1988 | Strunk et al. |
| 4,755,746 A | 7/1988 | Mallory et al. |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,771,234 A | 9/1988 | Cook et al. |
| 4,772,846 A | 9/1988 | Reeds |
| 4,777,434 A | 10/1988 | Miller et al. |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,810,981 A | 3/1989 | Herstein |
| 4,812,754 A | 3/1989 | Tracy et al. |
| 4,816,767 A | 3/1989 | Cannon et al. |
| 4,818,169 A | 4/1989 | Schram et al. |
| 4,827,211 A | 5/1989 | Strid et al. |
| 4,838,802 A | 6/1989 | Soar |
| 4,839,587 A | 6/1989 | Flatley et al. |
| 4,845,426 A | 7/1989 | Nolan et al. |
| 4,849,689 A | 7/1989 | Gleason |
| 4,853,613 A | 8/1989 | Sequeira et al. |
| 4,856,426 A | 8/1989 | Wirz |
| 4,856,904 A | 8/1989 | Akagawa |
| 4,858,160 A | 8/1989 | Strid et al. |
| 4,859,989 A | 8/1989 | McPherson |
| 4,871,883 A | 10/1989 | Guiol |
| 4,871,965 A | 10/1989 | Elbert et al. |
| 4,884,026 A | 11/1989 | Hayakawa et al. |
| 4,884,206 A | 11/1989 | Mate |
| 4,888,550 A | 12/1989 | Reid |
| 4,893,914 A | 1/1990 | Hancock et al. |
| 4,894,612 A | 1/1990 | Drake et al. |
| 4,896,109 A | 1/1990 | Rauscher |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,916,398 A | 4/1990 | Rath |
| 4,918,279 A | 4/1990 | Babel et al. |
| 4,918,374 A | 4/1990 | Stewart et al. |
| 4,923,407 A | 5/1990 | Rice et al. |
| 4,926,118 A | 5/1990 | O'Connor et al. |
| 4,933,634 A | 6/1990 | Cuzin et al. |
| 4,968,931 A | 11/1990 | Littlebury et al. |
| 4,978,907 A | 12/1990 | Smith |

| | | | | | |
|---|---|---|---|---|---|
| 4,978,914 A | 12/1990 | Akimoto et al. | 5,469,324 A | 11/1995 | Henderson et al. |
| 4,982,153 A | 1/1991 | Collins et al. | 5,475,316 A | 12/1995 | Hurley et al. |
| 4,994,737 A | 2/1991 | Carlton et al. | 5,477,011 A | 12/1995 | Singles et al. |
| 5,001,423 A | 3/1991 | Abrami et al. | 5,479,108 A | 12/1995 | Cheng |
| 5,006,796 A | 4/1991 | Burton et al. | 5,479,109 A | 12/1995 | Lau et al. |
| 5,010,296 A | 4/1991 | Okada et al. | 5,481,936 A | 1/1996 | Yanagisawa |
| 5,019,692 A | 5/1991 | Nbedi et al. | 5,486,975 A | 1/1996 | Shamouilian et al. |
| 5,030,907 A | 7/1991 | Yih et al. | 5,488,954 A | 2/1996 | Sleva et al. |
| 5,034,688 A | 7/1991 | Moulene et al. | 5,491,426 A | 2/1996 | Small |
| 5,041,782 A | 8/1991 | Marzan | 5,493,070 A | 2/1996 | Habu |
| 5,045,781 A | 9/1991 | Gleason et al. | 5,493,236 A | 2/1996 | Ishii et al. |
| 5,061,823 A | 10/1991 | Carroll | 5,500,606 A | 3/1996 | Holmes |
| 5,065,089 A | 11/1991 | Rich | 5,506,515 A | 4/1996 | Godshalk et al. |
| 5,065,092 A | 11/1991 | Sigler | 5,508,631 A | 4/1996 | Manku et al. |
| 5,066,357 A | 11/1991 | Smyth, Jr. et al. | 5,510,792 A | 4/1996 | Ono et al. |
| 5,070,297 A | 12/1991 | Kwon et al. | 5,511,010 A | 4/1996 | Burns |
| 5,077,523 A | 12/1991 | Blanz | 5,515,167 A | 5/1996 | Ledger et al. |
| 5,084,671 A | 1/1992 | Miyata et al. | 5,517,111 A | 5/1996 | Shelor |
| 5,089,774 A | 2/1992 | Nakano | 5,521,522 A | 5/1996 | Abe et al. |
| 5,091,691 A | 2/1992 | Kamieniecki et al. | 5,523,694 A | 6/1996 | Cole, Jr. |
| 5,095,891 A | 3/1992 | Reitter | 5,530,371 A | 6/1996 | Perry et al. |
| 5,097,207 A | 3/1992 | Blanz | 5,530,372 A | 6/1996 | Lee et al. |
| 5,101,149 A | 3/1992 | Adams et al. | 5,532,609 A | 7/1996 | Harwood et al. |
| 5,101,453 A | 3/1992 | Rumbaugh | 5,539,323 A | 7/1996 | Davis, Jr. |
| 5,103,169 A | 4/1992 | Heaton et al. | 5,546,012 A | 8/1996 | Perry et al. |
| 5,105,148 A | 4/1992 | Lee | 5,550,480 A | 8/1996 | Nelson et al. |
| 5,105,181 A | 4/1992 | Ross | 5,550,482 A | 8/1996 | Sano |
| 5,107,076 A | 4/1992 | Bullock et al. | 5,552,716 A | 9/1996 | Takahashi et al. |
| 5,142,224 A | 8/1992 | Smith et al. | 5,561,377 A | 10/1996 | Strid et al. |
| 5,144,228 A | 9/1992 | Sorna et al. | 5,561,585 A | 10/1996 | Barnes et al. |
| 5,159,752 A | 11/1992 | Mahant-Shetti et al. | 5,565,788 A | 10/1996 | Burr et al. |
| 5,160,883 A | 11/1992 | Blanz | 5,571,324 A | 11/1996 | Sago et al. |
| 5,164,661 A | 11/1992 | Jones | 5,572,398 A | 11/1996 | Federlin et al. |
| 5,166,606 A | 11/1992 | Blanz | 5,583,445 A | 12/1996 | Mullen |
| 5,172,049 A | 12/1992 | Kiyokawa et al. | 5,594,358 A | 1/1997 | Ishikawa et al. |
| 5,198,752 A | 3/1993 | Miyata et al. | 5,604,444 A | 2/1997 | Harwood et al. |
| 5,198,753 A | 3/1993 | Hamburgen | 5,610,529 A | 3/1997 | Schwindt |
| 5,198,756 A | 3/1993 | Jenkins et al. | 5,611,946 A | 3/1997 | Leong et al. |
| 5,198,758 A | 3/1993 | Iknaian et al. | 5,617,035 A | 4/1997 | Swapp |
| 5,202,558 A | 4/1993 | Barker | 5,629,631 A | 5/1997 | Perry et al. |
| 5,209,088 A | 5/1993 | Vaks | 5,631,571 A | 5/1997 | Spaziani et al. |
| 5,210,485 A | 5/1993 | Kreiger et al. | 5,640,101 A | 6/1997 | Kuji et al. |
| 5,214,243 A | 5/1993 | Johnson | 5,646,538 A | 7/1997 | Lide et al. |
| 5,214,374 A | 5/1993 | St. Onge | 5,657,394 A | 8/1997 | Schwartz et al. |
| 5,218,185 A | 6/1993 | Gross | 5,659,255 A | 8/1997 | Strid et al. |
| 5,220,277 A | 6/1993 | Reitinger | 5,663,653 A | 9/1997 | Schwindt et al. |
| 5,221,905 A | 6/1993 | Bhangu et al. | 5,666,063 A | 9/1997 | Abercrombie et al. |
| 5,225,037 A | 7/1993 | Elder et al. | 5,668,470 A | 9/1997 | Shelor |
| 5,225,796 A | 7/1993 | Williams et al. | 5,669,316 A | 9/1997 | Faz et al. |
| 5,237,267 A | 8/1993 | Harwood et al. | 5,670,888 A | 9/1997 | Cheng |
| 5,266,889 A | 11/1993 | Harwood et al. | 5,675,499 A | 10/1997 | Lee et al. |
| 5,278,494 A | 1/1994 | Obigane | 5,675,932 A | 10/1997 | Mauney |
| 5,280,156 A | 1/1994 | Niori et al. | 5,676,360 A | 10/1997 | Boucher et al. |
| 5,303,938 A | 4/1994 | Miller et al. | 5,680,039 A | 10/1997 | Mochizuki et al. |
| 5,315,237 A | 5/1994 | Iwakura et al. | 5,682,337 A | 10/1997 | El-Fishaway et al. |
| 5,321,352 A | 6/1994 | Takebuchi | 5,685,232 A | 11/1997 | Inoue |
| 5,325,052 A | 6/1994 | Yamashita | 5,712,571 A | 1/1998 | O'Donoghue |
| 5,334,931 A | 8/1994 | Clarke et al. | 5,729,150 A | 3/1998 | Schwindt |
| 5,336,989 A | 8/1994 | Hofer | 5,731,708 A | 3/1998 | Sobhami |
| 5,345,170 A | 9/1994 | Schwindt et al. | 5,773,951 A | 6/1998 | Markowski et al. |
| 5,369,370 A | 11/1994 | Stratmann et al. | 5,777,485 A | 7/1998 | Tanaka et al. |
| 5,371,457 A | 12/1994 | Lipp | 5,798,652 A | 8/1998 | Taraci |
| 5,373,231 A | 12/1994 | Boll et al. | 5,802,856 A | 9/1998 | Schaper et al. |
| 5,382,898 A | 1/1995 | Subramanian | 5,804,982 A | 9/1998 | Lo et al. |
| 5,397,855 A | 3/1995 | Ferlier | 5,804,983 A | 9/1998 | Nakajima et al. |
| 5,404,111 A | 4/1995 | Mori et al. | 5,807,107 A | 9/1998 | Bright et al. |
| 5,408,189 A | 4/1995 | Swart et al. | 5,811,751 A | 9/1998 | Leong et al. |
| 5,410,259 A | 4/1995 | Fujihara et al. | 5,828,225 A | 10/1998 | Obikane et al. |
| 5,422,574 A | 6/1995 | Kister | 5,831,442 A | 11/1998 | Heigl |
| 5,434,512 A | 7/1995 | Schwindt et al. | 5,835,997 A * | 11/1998 | Yassine ................. 324/754 |
| 5,451,884 A | 9/1995 | Sauerland | 5,838,161 A | 11/1998 | Akram et al. |
| 5,457,398 A | 10/1995 | Schwindt et al. | 5,847,569 A | 12/1998 | Ho et al. |
| 5,461,328 A | 10/1995 | Devereaux et al. | 5,848,500 A | 12/1998 | Kirk |

| | | | | | | |
|---|---|---|---|---|---|---|
| 5,857,667 A | 1/1999 | Lee | | 6,257,319 B1 | 7/2001 | Kainuma et al. |
| 5,861,743 A | 1/1999 | Pye et al. | | 6,259,261 B1 | 7/2001 | Engelking et al. |
| 5,869,975 A | 2/1999 | Strid et al. | | 6,271,673 B1 | 8/2001 | Furuta et al. |
| 5,874,361 A | 2/1999 | Collins et al. | | 6,284,971 B1 | 9/2001 | Atalar et al. |
| 5,879,289 A | 3/1999 | Yarush et al. | | 6,288,557 B1 | 9/2001 | Peters et al. |
| 5,883,522 A | 3/1999 | O'Boyle | | 6,292,760 B1 | 9/2001 | Burns |
| 5,883,523 A | 3/1999 | Ferland et al. | | 6,300,775 B1 | 10/2001 | Peach et al. |
| 5,892,539 A | 4/1999 | Colvin | | 6,310,755 B1 | 10/2001 | Kholodenko et al. |
| 5,900,737 A | 5/1999 | Graham et al. | | 6,313,649 B1 | 11/2001 | Harwood et al. |
| 5,903,143 A | 5/1999 | Mochizuki et al. | | 6,320,372 B1 | 11/2001 | Keller |
| 5,910,727 A | 6/1999 | Fujihara et al. | | 6,320,396 B1 | 11/2001 | Nikawa |
| 5,916,689 A | 6/1999 | Collins et al. | | 6,335,628 B2 | 1/2002 | Schwindt et al. |
| 5,923,177 A | 7/1999 | Wardwell | | 6,362,636 B1 | 3/2002 | Peters et al. |
| 5,942,907 A | 8/1999 | Chiang | | 6,380,751 B2 | 4/2002 | Harwood et al. |
| 5,945,836 A | 8/1999 | Sayre et al. | | 6,396,296 B1 | 5/2002 | Tarter et al. |
| 5,949,579 A | 9/1999 | Baker | | 6,407,560 B1 | 6/2002 | Walraven et al. |
| 5,952,842 A | 9/1999 | Fujimoto | | 6,424,141 B1 * | 7/2002 | Hollman et al. .......... 324/158.1 |
| 5,959,461 A | 9/1999 | Brown et al. | | 6,445,202 B1 | 9/2002 | Cowan et al. |
| 5,960,411 A | 9/1999 | Hartman et al. | | 6,480,013 B1 | 11/2002 | Nayler et al. |
| 5,963,027 A | 10/1999 | Peters | | 6,483,327 B1 | 11/2002 | Bruce et al. |
| 5,963,364 A | 10/1999 | Leong et al. | | 6,483,336 B1 | 11/2002 | Harris et al. |
| 5,973,505 A | 10/1999 | Strid et al. | | 6,486,687 B2 | 11/2002 | Harwood et al. |
| 5,982,166 A | 11/1999 | Mautz | | 6,488,405 B2 | 12/2002 | Eppes et al. |
| 5,995,914 A | 11/1999 | Cabot | | 6,489,789 B2 | 12/2002 | Peters et al. |
| 5,998,768 A | 12/1999 | Hunter et al. | | 6,492,822 B2 | 12/2002 | Schwindt et al. |
| 5,999,268 A | 12/1999 | Yonezawa et al. | | 6,501,289 B1 | 12/2002 | Takekoshi |
| 6,001,760 A | 12/1999 | Katsuda et al. | | 6,549,022 B1 | 4/2003 | Cole, Jr. et al. |
| 6,002,263 A | 12/1999 | Peters et al. | | 6,549,026 B1 | 4/2003 | Dibattista et al. |
| 6,002,426 A | 12/1999 | Back et al. | | 6,549,106 B2 | 4/2003 | Martin |
| 6,013,586 A | 1/2000 | McGhee et al. | | 6,573,702 B2 | 6/2003 | Marcuse et al. |
| 6,023,209 A | 2/2000 | Faulkner et al. | | 6,605,951 B1 | 8/2003 | Cowan |
| 6,028,435 A | 2/2000 | Nikawa | | 6,605,955 B1 | 8/2003 | Costello et al. |
| 6,029,141 A | 2/2000 | Bezos et al. | | 6,608,494 B1 | 8/2003 | Bruce et al. |
| 6,031,383 A * | 2/2000 | Streib et al. ................. 324/754 | | 6,608,496 B1 | 8/2003 | Strid et al. |
| 6,034,533 A | 3/2000 | Tervo et al. | | 6,617,862 B1 | 9/2003 | Bruce |
| 6,037,785 A | 3/2000 | Higgins | | 6,621,082 B2 | 9/2003 | Morita et al. |
| 6,037,793 A | 3/2000 | Miyazawa et al. | | 6,624,891 B2 | 9/2003 | Marcus et al. |
| 6,043,667 A | 3/2000 | Cadwallader et al. | | 6,633,174 B1 | 10/2003 | Satya et al. |
| 6,049,216 A | 4/2000 | Yang et al. | | 6,636,059 B2 | 10/2003 | Harwood et al. |
| 6,052,653 A | 4/2000 | Mazur et al. | | 6,639,415 B2 | 10/2003 | Peters et al. |
| 6,054,869 A | 4/2000 | Hutton et al. | | 6,642,732 B2 | 11/2003 | Cowan et al. |
| 6,060,888 A | 5/2000 | Blackham et al. | | 6,643,597 B1 | 11/2003 | Dunsmore |
| 6,060,891 A | 5/2000 | Hembree et al. | | 6,686,753 B1 | 2/2004 | Kitahata |
| 6,078,183 A | 6/2000 | Cole, Jr. | | 6,701,265 B1 | 3/2004 | Hill et al. |
| 6,091,236 A | 7/2000 | Piety et al. | | 6,710,798 B1 | 3/2004 | Hershel et al. |
| 6,091,255 A | 7/2000 | Godfrey | | 6,720,782 B2 | 4/2004 | Schwindt et al. |
| 6,096,567 A | 8/2000 | Kaplan et al. | | 6,724,205 B1 | 4/2004 | Hayden et al. |
| 6,104,203 A | 8/2000 | Costello et al. | | 6,724,928 B1 | 4/2004 | Davis |
| 6,111,419 A | 8/2000 | Lefever et al. | | 6,734,687 B1 | 5/2004 | Ishitani et al. |
| 6,114,865 A | 9/2000 | Lagowski et al. | | 6,744,268 B2 | 6/2004 | Hollman |
| 6,118,894 A | 9/2000 | Schwartz et al. | | 6,771,090 B2 | 8/2004 | Harris et al. |
| 6,121,783 A | 9/2000 | Horner et al. | | 6,771,806 B1 | 8/2004 | Satya et al. |
| 6,124,723 A | 9/2000 | Costello | | 6,774,651 B1 | 8/2004 | Hembree |
| 6,124,725 A | 9/2000 | Sato | | 6,777,964 B2 | 8/2004 | Navratil et al. |
| 6,127,831 A | 10/2000 | Khoury et al. | | 6,788,093 B2 | 9/2004 | Aitren et al. |
| 6,130,544 A | 10/2000 | Strid et al. | | 6,791,344 B2 | 9/2004 | Cook et al. |
| 6,137,302 A | 10/2000 | Schwindt | | 6,801,047 B2 | 10/2004 | Harwood et al. |
| 6,137,303 A | 10/2000 | Deckert et al. | | 6,806,724 B2 | 10/2004 | Hayden et al. |
| 6,144,212 A | 11/2000 | Mizuta | | 6,836,135 B2 | 12/2004 | Harris et al. |
| 6,147,851 A | 11/2000 | Anderson | | 6,838,885 B2 | 1/2005 | Kamitani |
| 6,160,407 A | 12/2000 | Nikawa | | 6,842,024 B2 | 1/2005 | Peters et al. |
| 6,194,907 B1 | 2/2001 | Kanao et al. | | 6,843,024 B2 | 1/2005 | Nozaki et al. |
| 6,198,299 B1 | 3/2001 | Hollman | | 6,847,219 B1 | 1/2005 | Lesher et al. |
| 6,211,663 B1 | 4/2001 | Moulthrop et al. | | 6,856,129 B2 | 2/2005 | Thomas et al. |
| 6,222,970 B1 | 4/2001 | Wach et al. | | 6,861,856 B2 * | 3/2005 | Dunklee et al. ............ 324/754 |
| 6,232,787 B1 | 5/2001 | Lo et al. | | 6,873,167 B2 | 3/2005 | Goto et al. |
| 6,232,788 B1 | 5/2001 | Schwindt et al. | | 6,885,197 B2 | 4/2005 | Harris et al. |
| 6,232,789 B1 | 5/2001 | Schwindt | | 6,900,646 B2 | 5/2005 | Kasukabe et al. |
| 6,232,790 B1 | 5/2001 | Bryan et al. | | 6,900,647 B2 | 5/2005 | Yoshida et al. |
| 6,236,975 B1 | 5/2001 | Boe et al. | | 6,900,652 B2 | 5/2005 | Mazur |
| 6,236,977 B1 | 5/2001 | Verba et al. | | 6,900,653 B2 | 5/2005 | Yu et al. |
| 6,245,692 B1 | 6/2001 | Pearce et al. | | 6,902,941 B2 | 6/2005 | Sun |
| 6,252,392 B1 | 6/2001 | Peters | | 6,903,563 B2 | 6/2005 | Yoshida et al. |

| | | |
|---|---|---|
| 6,927,079 B1 | 8/2005 | Fyfield |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,101,797 B2 | 9/2006 | Yuasa |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0030549 A1 | 10/2001 | Gleason et al. |
| 2002/0075027 A1 | 6/2002 | Hollman et al. |
| 2002/0118009 A1 | 8/2002 | Hollman et al. |
| 2003/0057513 A1 | 3/2003 | Alexander |
| 2003/0062915 A1 | 4/2003 | Arnold et al. |
| 2003/0071631 A1 | 4/2003 | Alexander |
| 2003/0141861 A1* | 7/2003 | Navratil et al. .......... 324/158.1 |
| 2004/0061514 A1 | 4/2004 | Schwindt et al. |
| 2004/0095145 A1 | 5/2004 | Boudiaf et al. |
| 2004/0100276 A1 | 5/2004 | Fanton |
| 2004/0113639 A1 | 6/2004 | Dunklee et al. |
| 2004/0162689 A1 | 8/2004 | Jamneala et al. |
| 2004/0193382 A1 | 9/2004 | Adamian et al. |
| 2004/0199350 A1 | 10/2004 | Blackham et al. |
| 2004/0207424 A1 | 10/2004 | Hollman |
| 2004/0251922 A1 | 12/2004 | Martens et al. |
| 2005/0024069 A1 | 2/2005 | Hayden et al. |
| 2005/0099192 A1 | 5/2005 | Dunklee et al. |
| 2005/0227503 A1 | 10/2005 | Reitinger |
| 2006/0114012 A1 | 6/2006 | Reitinger |
| 2006/0158207 A1 | 7/2006 | Reitinger |

FOREIGN PATENT DOCUMENTS

| | | |
|---|---|---|
| DE | 31 14 466 | 3/1982 |
| DE | 31 25 552 | 11/1982 |
| DE | 41 09 908 | 10/1992 |
| DE | 43 16 111 | 11/1994 |
| DE | 195 41 334 | 9/1996 |
| DE | 196 16 212 | 10/1996 |
| DE | 196 18 717 | 1/1998 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 505 981 | 9/1992 |
| EP | 0 574 149 | 12/1993 |
| EP | 0 706 210 | 4/1996 |
| EP | 0 573 183 | 1/1999 |
| GB | 2 197 081 | 5/1988 |
| JP | 53-052354 | 5/1978 |
| JP | 56-007439 | 1/1981 |
| JP | 62-011243 | 1/1987 |
| JP | 63-143814 | 6/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22837 | 1/1990 |
| JP | 2-22873 | 1/1990 |
| JP | 3-175367 | 7/1991 |
| JP | 4-732 | 1/1992 |
| JP | 5-157790 | 6/1993 |
| JP | 5-166893 | 7/1993 |
| JP | 60-71425 | 3/1994 |
| JP | 7005078 | 1/1995 |
| JP | 10-116866 | 5/1998 |
| JP | 11-031724 | 2/1999 |
| JP | 11031724 | 2/1999 |
| JP | 2001-189285 | 7/2001 |
| JP | 2001-189378 | 7/2001 |
| JP | 2002033374 | 1/2002 |
| JP | 2002-164396 | 6/2002 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |

OTHER PUBLICATIONS

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18th Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Signatone S-1240 Thermal Controller, 2 page description.
Eric Phizicky, Philippe I.H. Bastiaens, Heng Zhu, Michael Snyder, & Stanley Fields, "Protein analysis on a proteomic scale," Nature 422, insight: review article, Mar. 13, 2003.
The Micromanipulator Company, "Semi-Automatic Probing Stations and Accessories," pp. 1-12.
Integrated Technology Corporation, "Probitt PB500A Probe Card Repair and Analysis Station," 4 pages.
Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.
Eric Strid (Cascade Microtech), "Planar Impedance Standards and Accuracy Considerations in Vector Network Analysis," Jun. 1986, 8 pages.
J. Martens, Anritsu Company, 490 Jarvis Drive, Morgan Hill, CA 95037, "Multiport SOLR Calibrations: Performance and an Analysis of some Standards Dependencies," pp. 205-213.
Maury Microwave Corporation, "MT950 Series Transistor Test Fixture (TTF) Notice! Notice! Notice!," May 31, 1985.
Maury Microwave Corporation, MT950 Series Transistor Test Fixture (TTF), Oct. 7, 1982, 4 pages.
Temptronic Corporation, "Model TPO3000 Series ThermoChuck Systems for Probing, Characterization and Failure analysis of Wafers, Chips and Hybrids at High and Low Temperatures," pp. 2-5.
Cascade Microtech, "Model 42/42D Microwave Probe Station Instruction Manual, Electrical Operation," pp. 4-1-4-42.
Inter-Continental Microwave, "Microwave Semiconductor Chip Measurements using the HP 8510B TRL-Calibration Technique," Application Note: 101.
Design Technique, "Microstrip Microwave Test Fixture," May 1986, 2 pages.
PHOTO: Micromanipulator Probe Station 1994.
Micromanipulator Sales and Services Inc., "Test Station Accessories," Copyright 1983, 1984, 1 page.
Ruedi Aebersold & Matthias Mann, "Insight Review Articles, Mass spectrometry-based proteomics," Nature, vol. 422, Mar. 13, 2003, pp. 198-207.
Keithley Instruments, Inc. "Low-Level Measurements for Effective Low Current, Low Voltage, and High Impedance Measurements," Revised Third Edition, Printed Jun. 1984.
Inter-Continental Microwave, 2370-B Walsh Avenue, Santa Clara, CA 95051, "Product Catalog,".
Hewlett Packard, "HP 4284A Precision LCR Meter Operation Manual (Including Option 001,002,006,201,202,301)," Third Edition, Dec. 1991, pp. 2-1, 6-9, 6-15.
Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.
Cascade Microtech Technical Brief, A Guide to Better Vector Network Analyzer Calibrations for Probe-Tip Measurements, Copyright 1994, 2 pages.
TEMPTRONIC, "Guarded" Chuck Sketch, Nov. 15, 1989.
Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8.
Andrej Sali, Robert Glaeser, Thomas Earnest & Wolfgang Baumeister, "From words to literature in structural proteomics," Insight: Review Article, Nature 422, pp. 216-225, Mar. 13, 2003.
Mike Tyers & Matthias Mann, "From genomics to proteomics," Insight overview, Nature vol. 422 Mar. 2003, pp. 193-197.
William Knauer, "Fixturing for Low-Current/Low-Voltage Parametric Testing," Evaluation Engineering, Nov. 1990, pp. 9-12.
J.D.Tompkins, "Evaluating High Speed AC Testers," IBM Technical Disclosure Bulletin, vol. 13, No. 7 Dec. 1970, p. 180.
Jim Fitzpatrick, "Error Models for Systems Measurement," Microwave Journal, May 1978, pp. 63-66.
Sam Hanash, "Disease proteomics," Insight Review Articles, Nature, vol. 422, Mar. 13, 2003, pp. 226-232.
Design Technique International, "Adjustable Test Fixture," Copyright 1988.
Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.
Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.
R. Y. Koyama & M. G. Buehler, "Semiconductor Measurement Technology: A Wafer Chuck for Use Between -196 and 350° C," U.S. Department of Commerce, National Technical Information Service, PB-293 298, Issued Jan. 1979.
Ken Cole, "ThermoChuck Performance (Fax)," 2 pages, Mar. 10, 1995.
S. Beck & E. Tomann, "Chip Tester," IBM Technical Disclosure Bulletin, Jan. 1985.
Applied Precision, "Checkpoint," 2 pages, 8505 SE 68th Street, Mercer Island, Washington 98040.
L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.
Daniel Van Der Weide, "THz Frequency Science & Technology Biomolecular Interaction Sensing with Sub-Terahertz Fields," University of Wisconsin-Madison, 2 pages.
Mark S. Boguski & Martin W. McIntosh, "Biomedical Informatics for proteomics," Insight: review article, Nature 422, Mar. 13, 2003, pp. 233-237.
Saswata Basu & Reed Gleason, "A Membrane Quadrant Probe for R&D Applications," Cascade Microtech, Inc. 14255 SW Brigadoon Ct., Beaverton, OR 97005, 3 pages.
The Micromanipulator Company, Inc., "Model 8000 Test Station," 1986, 1 page.
The Micromanipulator Company, Inc. "Model 8000 Test Station," 1988, 1 page.
"Vacuum," Mechanical Operation, pp. 3-8-3-9.
The Micromanipulator Company, Inc,, "Accessories: Hot and Hot/Cold Chucks, Integrated Dry environments, Triaxial chucks, Integrated Shielded and Dark environments, Probe Card Holders," p. 8.
Microwave Products, Microwave Journal, Sep. 1988, 1 page.
Cascade Microtech, "Advanced On-Wafer Device Characterization Using the Summit 10500," pp. 2-20.
Saswata Basu & Leonard Hayden, "An SOLR Calibration for Accurate Measurement of Orthogonal On-Wafer Duts," IEEE MTT-S Digest, 1997, pp. 1335-1336, 1338.
Hewlett Packard, "HP 4142B Modular DC source/Monitor Practical Applications—High Speed DC Characterization of Semiconductor Devices from Sub pA to 1A," Nov. 1987, pp. 1-4.
Doug Rytting, "Appendix to an Analysis of Vector Measurement Accuracy Enhancement Techniques," pp. 1-42, Hewlett Packard.
Temptronic Corporation, "Application Note 1 Controlled Environment Enclosure For low temperature wafer probing in a moisture-free environment," 2 pages.
*Cascade Microtech, Inc.* vs. *Micromanipulator Company, Inc.*, "Deposition of Harry F. Applebay," United States District Court for the District of Oregon, Lead Case No. 97-479-AI.
Flexion Corporation, "Cryotest Station MP-3," *Cascade Microtech, Inc.* vs. *Micromanipulator Company, Inc.*, Applebay Exhibit 576, May 13, 1998, 68 pages.
Flexion Corporation, "Cryotest Station MP-3," *Cascade Microtech, Inc.* vs. *Micromanipulator Company, Inc.*, Applebay Exhibit 578, May 13, 1998, 1 page.
*Cascade Microtech, Inc.* vs. *Micromanipulator Company, Inc.*, Applebay Exhibit 572, May 13, 1998, 2 pages.
*Cascade Mirotech, Inc.* vs. *Micromanipulator Company, Inc.*, Applebay Exhibits 581A, 581B, and 581C, May 13, 1998, 3 pages.
Flexion Corporation, "AP-1 Cryotest Station," Applebay Exhibit 582, May 13, 1998, 20 pages.
Flexion Corporation, "AP-1 Cryotest Station User Manual," Applebay Exhibit 583, May 13, 1998, 187 pages.
*Cascade Microtech, Inc.* vs. *Micromanipulator Company, Inc.*, Applebay Exhibits 577A, 577B, 577C, May 13, 1998, 3 pages.
*Cascade Microtech, Inc.* vs. *Micromanipulator Company, Inc.*, Applebay Exhibit 585, May 13, 1998, 7 pages.

* cited by examiner

PROBE STATION WITH LOW INDUCTANCE PATH

This application claims the benefit of Provisional U.S. Patent Application Ser. No. 60/429,082 filed Nov. 25, 2002.

BACKGROUND OF THE INVENTION

The present invention relates to probe stations, commonly known as package or wafer probers, used manually, semi-automatically, or fully automatically to test electrical devices such as semiconductor wafers.

Existing probe stations are capable of performing both low-current and high frequency measurements in an electronically quiet environment. The environment may be provided by, for example, incorporating one or more guard and electromagnetic interference (EMI) shield structures within an environmental enclosure. Guard and EMI shield structures are well known and discussed extensively in technical literature. See, for example, an article by William Knauer entitled "Fixturing for Low Current/Low Voltage Parametric Testing" appearing in *Evaluation Engineering*, November, 1990, pages 150-153. Examples of existing probe stations that provide such guard and EMI shield structures can be found in commonly owned U.S. Pat. Nos. 5,434,512; and 5,266,889 which are hereby incorporated by reference.

Probe stations deliver a test signal to an electrical device, such as a semiconductor wafer, whose characteristics are to be measured. Test conditions are desirably controlled and substantially free of electromagnetic interference, though not necessarily, that may emanate from test instrumentation or other nearby electrical equipment, or that may result from spurious air currents or the like. To provide a controlled and substantially noise-free test environment, existing probe stations that incorporate guard structures will usually at least partially surround the test signal path with a guard signal that closely approximates the test signal, thus inhibiting electromagnetic current leakage from the test signal path to its immediately surrounding environment. Similarly, EMI shield structures may provide a shield signal to the environmental enclosure surrounding much of the perimeter of the probing environment. The environmental enclosure may typically be connected to shield, earth ground, instrumentation ground, or some other desired potential.

To provide test, guard, and shield signals to the probe station, existing probe stations often include a multistage chuck upon which the electrical device rests while being tested. The top stage of the chuck, which supports the electrical device, typically comprises a solid, electrically conductive metal plate through which the test signal may be routed. A middle stage and a bottom stage of the chuck similarly comprise solid electrically conductive plates through which a guard signal and a shield signal may be routed, respectively. In this fashion, an electrical device resting on such a multistage chuck may be both guarded and shielded from below. Similarly, single stage and dual stage chucks, and chucks with substantial openings centrally defined therein are likewise frequently employed.

Further reduction in interference can be obtained by locating a suspended conductive plate over the electrical device which is typically electrically insulated from the test signal path and connected to the guard signal. The suspended plate defines a central opening so that the probe assembly may make electrical contact with the electrical device. In this fashion, the electrical device can be guarded from both below and above by signals closely approximating that delivered to the electrical device.

Though such a probe station is effective in performing low-current testing and high frequency testing of electrical devices, the aforementioned existing probe stations unfortunately often exhibit significant inductance to high current measurements, and particularly when testing using pulsed signals. The high inductance tends to resist fast changes in the current levels, and results in higher than desirable voltage and current levels.

What is desired, therefore, is a probe station that is suitable for performing high current and/or pulsed tests.

DETAILED DESCRIPTION OF THE PREFERRED EMBODIMENT

Figure 1:
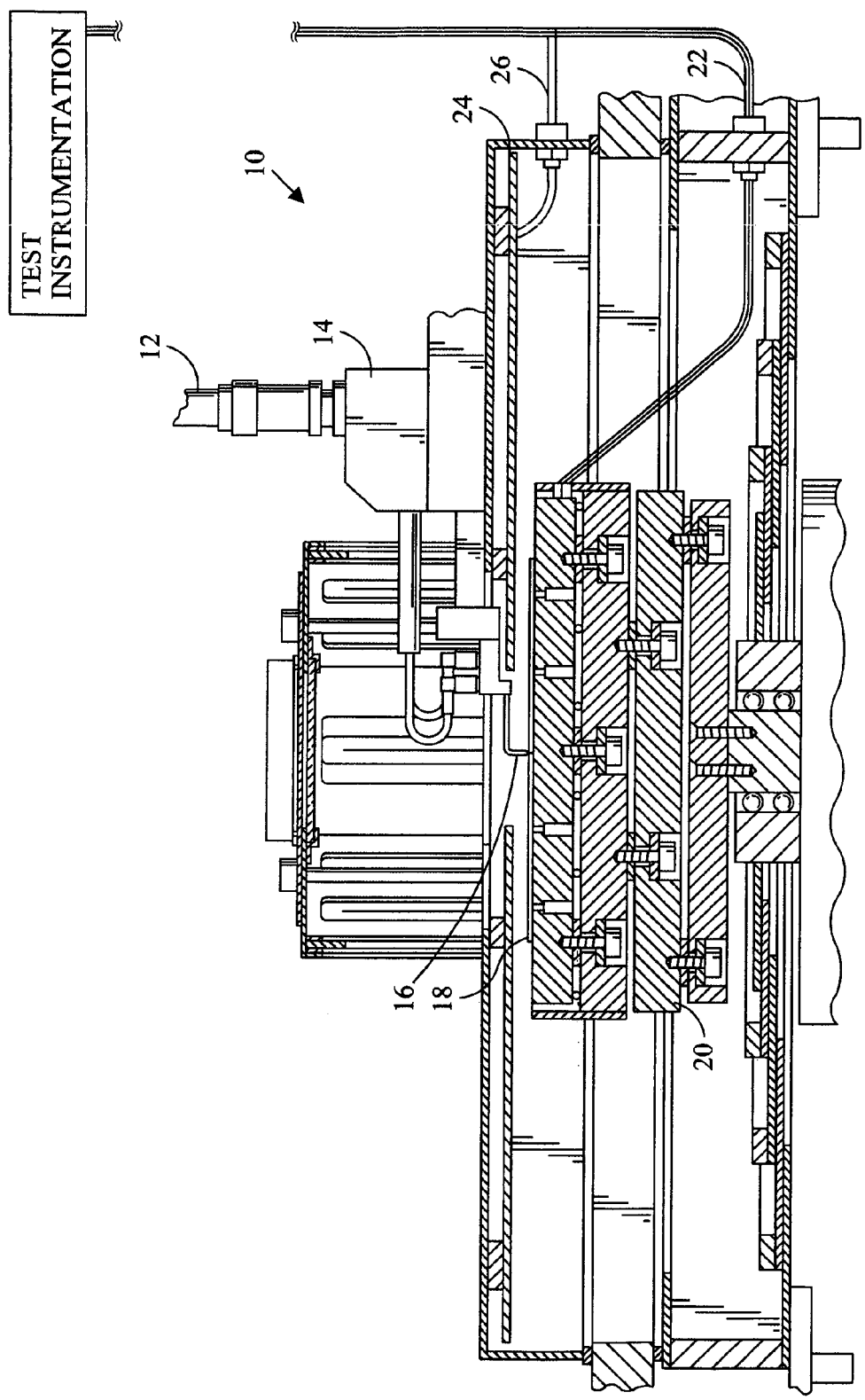
FIG. 1 shows a schematic of an existing probe station having guard and electromagnetic shield structures.

FIG. 1 shows a general schematic diagram of an existing probe station 10 having guard and electromagnetic shield structures. A test signal is provided through a test path 12 to a probe 14 having probe needles 16 that contact an electrical device 18 resting upon a chuck 20. The probe needles may alternatively be any type of contacts, such as for example, probe cards, probes on movable positioners, optical signals, and membrane probes. The chuck 20 receives a guard signal through a first transmission line 22 while a suspended guard member 24 receives a guard signal through a second transmission line 26. The first transmission line 22 likewise includes a test signal path to the chuck 20. The first transmission line 22, the test path 12, the probe 14, the needles 16, the device 18, and the chuck 20 together form a large loop, as shown in FIG. 1, to a common signal source at the test instrumentation. Normally within the probe station the transmission line 22 is within a service loop that is several feet long to accommodate movement of the chuck 20.

Figure 2:
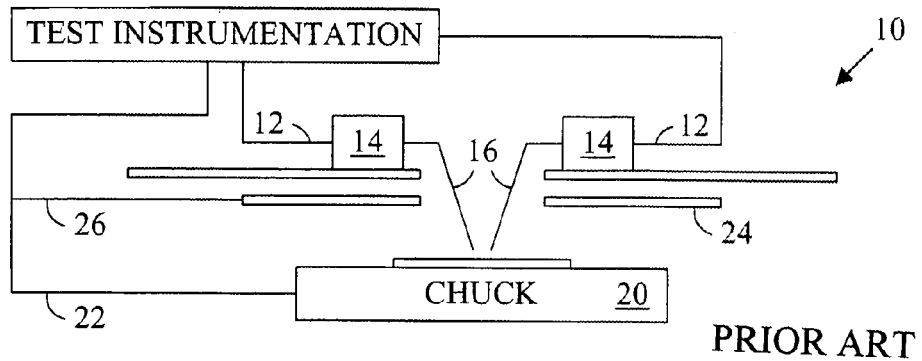
FIG. 2 illustrates a general schematic of FIG. 1.

The present inventors came to the realization that when using high current or pulsed tests, the large test loop that originates from the test equipment and passes through the chuck creates undesirable inductance. The inductance resulting from this large loop often interferes with test measurements, and in particular high current and/or pulsed signals. In addition, the transmission line 22 is normally a small conductor which is not especially suitable for carrying high currents. FIG. 2 illustrates more schematically the resulting test loop for purposes of clarity.

Figure 3:
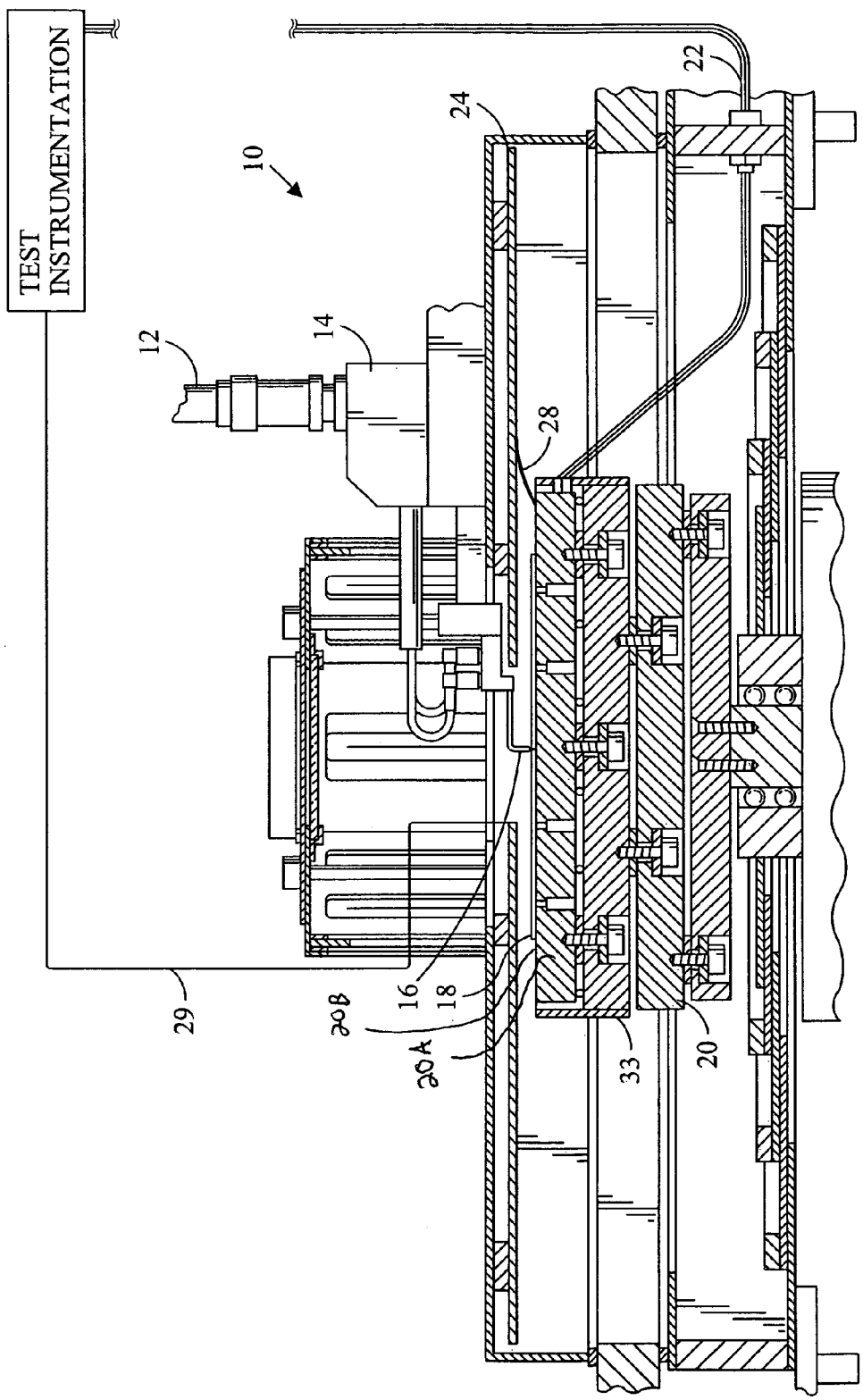
FIG. 3 shows schematic of a modified probe station exhibiting reduced inductance.

The present inventors further determined that reducing or otherwise modifying this previously unrecognized source of inductance for high current and/or pulsed signals, namely, the inductive test loop could improve such measurements. The modification may include modifying or otherwise providing another test signal path from the chuck 20 to the test instrumentation. FIG. 3 shows one embodiment of a probe station 10 with a test loop having a decreased length. Rather than routing the test signal from the chuck 20 through transmission line 22, a transmission line 28 may interconnect the chuck 20 with the suspended guard member 24, which is then electrically connected to the test instrumentation by another transmission line 29. The suspended guard member 24 typically has its guard potential removed when performing this test. Accordingly, the suspended guard member 24 is being used in a non-traditional manner, namely, not interconnected to a guard potential. The interconnection of the transmission line 28 at the chuck 20 may be one of the layers of the chuck 20 such as the top layer 20A of the chuck 20 that defines the surface 20B that supports an electrical device being probed. The at least partially encircling conductive member 33, normally connected to guard potential, may have a height greater than the top surface of the chuck, even with the top surface of the chuck, or below the top surface of the chuck. Preferably, there is an air gap between the conductive member 33 and the chuck 20. The air gap may be partially filled, substantially filled, or completely filled with dielectric material. The signal path to or from the top surface of the chuck may be provided through an opening in the conductive member 33. Electrically connecting the chuck 20 to the suspended guard member 24 by the transmission line 28, and to the test instrumentation by transmission line 29, results in a smaller loop path than that provided by previously existing probe stations, as shown schematically in FIG. 4. By reducing the length of the test path loop, electrical performance is improved, particularly when testing an electrical device using high-current and/or pulsed signals.

It is to be understood that the suspended plate may be suspended from above, typically using insulators, or supported by supports from within the probe station, or supported by the chuck or chuck assembly. Normally the suspended plate does not move together with the chuck 20, but is rather maintained in a fixed spatial relationship with respect to the probe station 10. Also, it is to be understood that the suspended plate may be any conductive member within the probe station that has the characteristic that it does not move together with the chuck 20, but is rather maintained in a fixed spatial relationship with respect to the probe station 10. Alternatively, the suspended member may be any conductive member within the probe station that is free from being electrically connected to a guard and/or shield potential when used in the aforementioned configuration.

The interconnections from the chuck 20 to the suspended guard 24 is preferably totally within the environmental enclosure. A further explanation of the environmental enclosure is disclosed in U.S. Pat. No. 5,457,398, incorporated by reference herein. Interconnection within the environmental enclosure potentially reduces the length of the conductive path to less than it would have been had the interconnection been, at least in part, exterior to the environmental enclosure, or otherwise the test path passing from within the environmental enclosure to outside the environmental enclosure to within the environmental enclosure.

Figure 4:
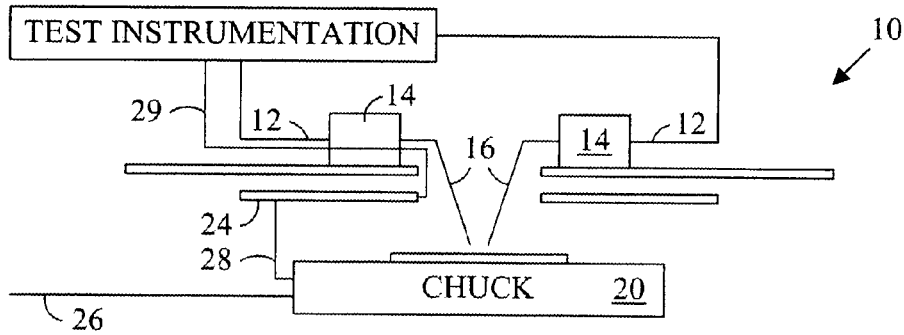
FIG. 4 illustrates a general schematic of FIG. 3.
Figure 5:
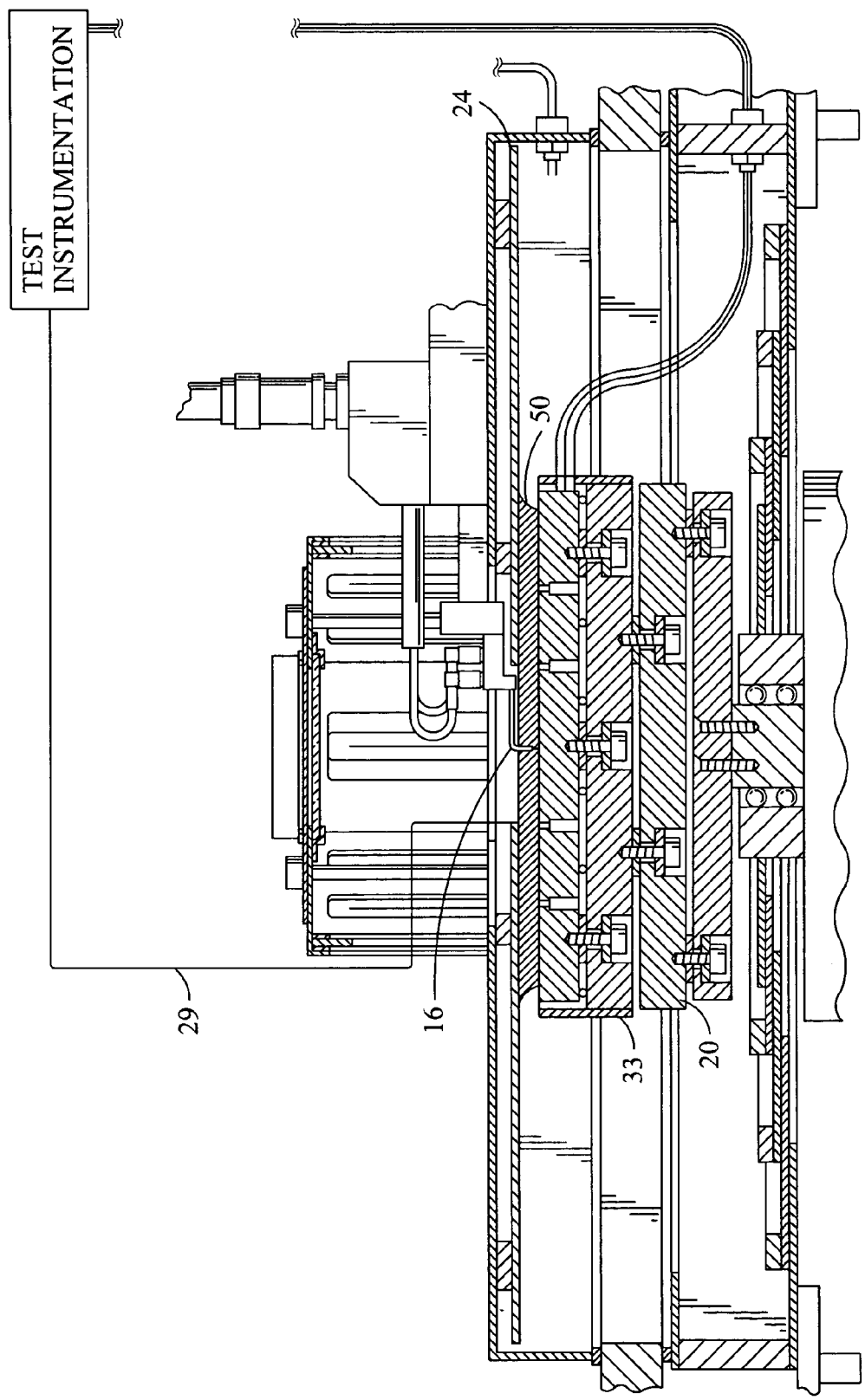
FIG. 5 shows schematic of another modified probe station exhibiting reduced inductance.

The transmission lines 28 and 29, shown schematically in FIGS. 2-4 may be embodied in many different structures. For example, the transmission lines 28 and 29 may be a traditional transmission line, such as a wire, coaxial cable, triaxial cable, and one or more conductive tabs. Alternatively, as depicted in FIG. 5, the transmission line 28 may comprise a conductive shell or bowl 50 that contacts the test path of the chuck 20 (e.g., top layer) at its lower end and the suspended plate 24 at its upper end. The shell 50 preferably encircles a major portion of the chuck 20 and more preferably substantially all of the chuck 20. In addition, the shell 50 while preferably forming a substantially closed loop may have a size less than, at least in part, the exterior periphery defined by the chuck 20. Also, preferably the conductive shell 50 includes a flexible upper portion in contact with the suspended member so that upon pressing engagement a good conductive interconnection is made even while the conductive shell 50 moves horizontally relative to the suspended plate 24. Moreover, the shell 50 may be detachably engageable with the suspended member by changing its height, such as for example, using "flip-up" fingers. In addition, a flexible upper portion also permits a greater range of movement of the chuck in the z-axis direction. In addition, the shell may be solid, flexible, and/or perforated with openings as desired. The openings, in particular, may be useful for permitting air flow around the device under test.

Figure 6:
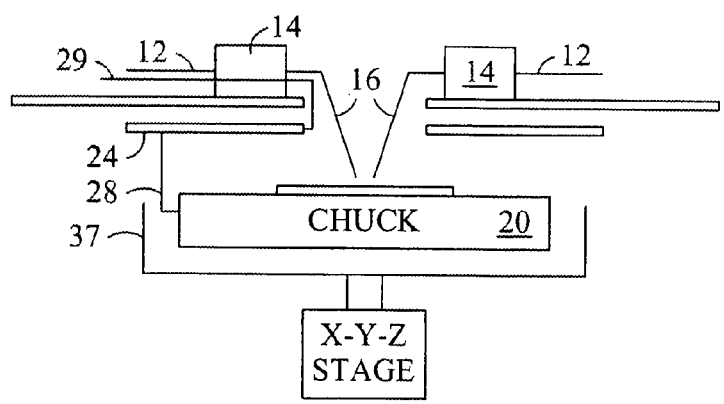
FIG. 6 shows schematic of yet another modified probe station exhibiting reduced inductance.

Referring to FIG. 6, the reduced inductance test path may be included within the structure that includes an enclosure 37 that surrounds the chuck therein. During testing of the device under test the enclosure 37 moves together with the chuck 20. The interconnection 28 to the suspended member may be by a cable or otherwise from a location within the chamber or otherwise connected to the chuck therein.

Figure 7:
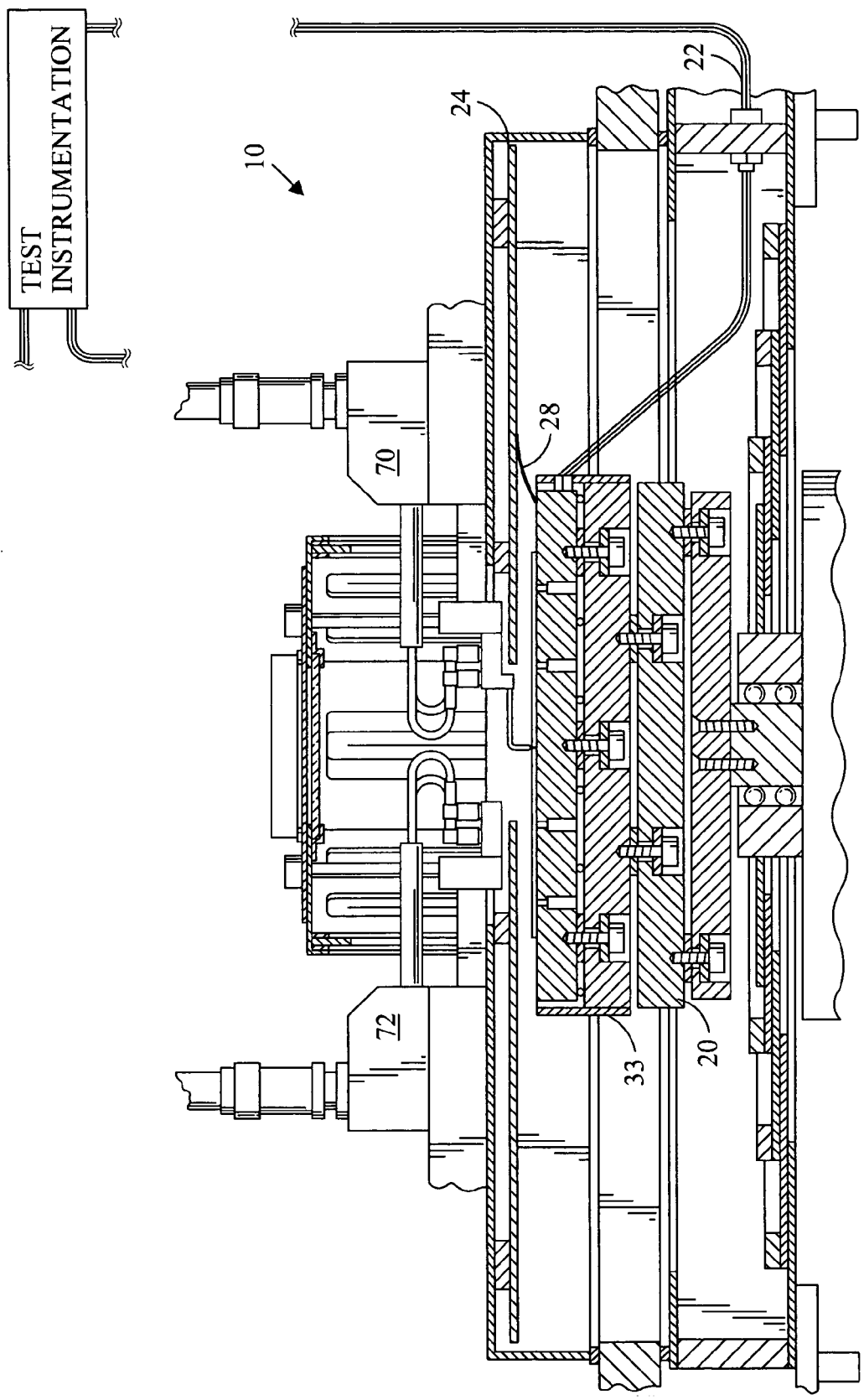
FIG. 7 shows schematic of a further modified probe station exhibiting reduced inductance.

Referring to FIG. 7, a dual probe assembly may be used to provide a test signal path. A first probe 70 may provide a test signal to the device under test. The test signal then passes through the device under test and to the chuck 20. The chuck 20 is electrically interconnected to the suspended plate 24. A second probe 72 may receive the test signal from the suspended plate 24. Alternatively, the second probe 72 may be directly interconnected to the chuck 20 to receive the test signal.

Figure 8:
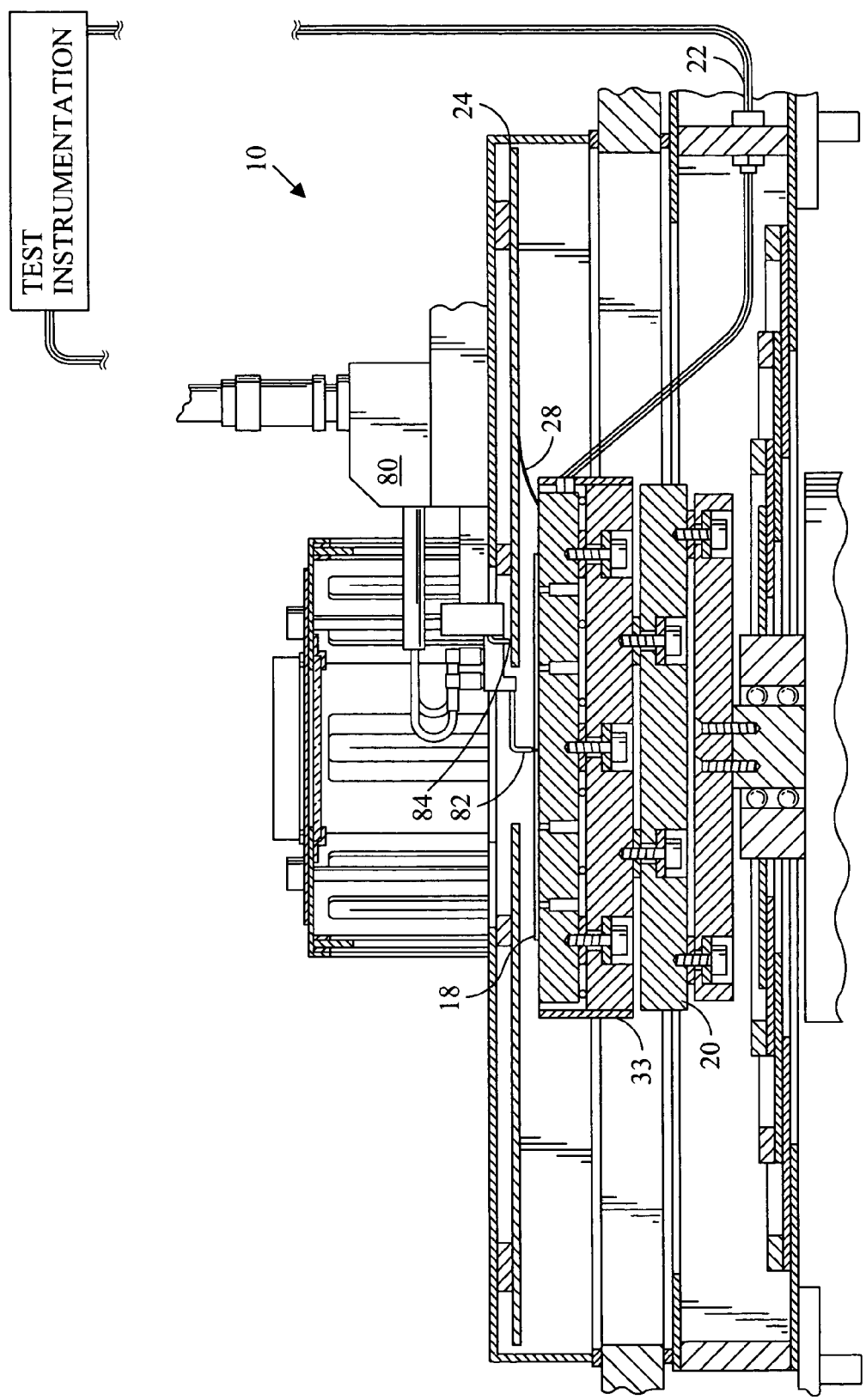
FIG. 8 shows schematic of a modified probe station exhibiting reduced inductance.

Referring to FIG. 8, a single probe assembly 80 may be used to provide and sense a test signal path. The probe 80 may provide a test signal to the device under test through a first probe tip 82. The test signal then passes through the device under test and to the chuck 20. The chuck 20 is electrically interconnected to the suspended plate 24. The single probe assembly 80 may receive the test signal from the suspended plate 24 through a second probe tip 84. Alternatively, the second tip of the probe assembly 80 may be direct interconnection to the chuck 20 to receive the test signal. In this manner a single probe assembly may both provide the test signal and sense the test signal. Also, it is preferred that the interconnected from the probe assembly 80 to the test instrumentation is a single cable assembly, more preferably a twisted pair of wires, to minimize inductance. The twisted pair of wires preferably extends at least 50% of the distance between the probe and the test instrumentation.

The terms and expressions employed in the foregoing specification are used therein as terms of description and not of limitation, and there is no intention in the use of such terms and expressions of excluding equivalents of the features shown and described or portions thereof, it being recognized that the scope of the invention is defined and limited only by the claims that follow.

The invention claimed is:

1. A probe assembly for probing an electrical device, said probe assembly comprising:
   (a) a chuck having a first conductive member with a support surface suitable for supporting an electrical device; and
   (b) a second conductive member having a substantially planar surface spaced apart from, and opposed to, said support surface of said chuck, wherein said support surface is electrically interconnected to said second conductive member;
   (c) wherein said second conductive member is electrically interconnected to a test signal of said electrical device.

2. The probe assembly of claim 1 wherein said first conductive member comprises a first plate, said second conductive member comprises a second plate, and wherein said second conductive member is spaced further distant from said electrical device than said first conductive member.

3. The probe assembly of claim 1 wherein said second conductive member comprises a second plate and is vertically spaced apart from said first conductive member.

4. The probe assembly of claim 1 wherein said second conductive member is electrically interconnected to said support surface completely within an environmental chamber.

5. The probe assembly of claim 1 wherein said second conductive member is free from being supported by said chuck.

6. The probe assembly of claim 1 wherein said first conductive member is electrically interconnected to a first probe, wherein said second conductive member is electrically interconnected to a second probe.

7. The probe assembly of claim 1 wherein said first conductive member and said second conductive member are electrically interconnected to a first probe.

8. The probe assembly of claim 1 wherein said first conductive member is electrically interconnected to a first probe and wherein said first probe is electrically interconnected to test instrumentation using a conductive element having a length, at least 50% of said length comprising a twisted pair of wires.

9. The probe assembly of claim 1 further comprising a detachable substantially closed loop member engageable with said first conductive member and said second conductive member, where said loop member includes a flexible member interconnecting said first conductive member and said second conductive member.

* * * * *